(12) United States Patent
Han et al.

(10) Patent No.: US 10,565,910 B2
(45) Date of Patent: Feb. 18, 2020

(54) ADJUSTMENT DEVICE FOR LIGHT-ON TESTING AND LIGHT-ON TESTING DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Long Han, Beijing (CN); Libin Liu, Beijing (CN)

(73) Assignees: BOE TECHNOLOGY GROUP CO., LTD., Beijing (CN); ORDOS YUANSHENG OPTOELECTRONICS CO., LTD., Dongsheng District (CN)

(*) Notice: Subject to any disclaimer, the term of this patent is extended or adjusted under 35 U.S.C. 154(b) by 260 days.

(21) Appl. No.: 15/549,303

(22) PCT Filed: Jan. 24, 2017

(86) PCT No.: PCT/CN2017/072461
§ 371 (c)(1),
(2) Date: Aug. 7, 2017

(87) PCT Pub. No.: WO2017/181755
PCT Pub. Date: Oct. 26, 2017

(65) Prior Publication Data
US 2018/0068601 A1   Mar. 8, 2018

(30) Foreign Application Priority Data
Apr. 19, 2016   (CN) .................... 2016 2 0332985 U (51) Int. Cl.
*G09G 3/00* (2006.01)
*G01R 1/067* (2006.01)
(Continued)

(52) U.S. Cl.
CPC ............. *G09G 3/006* (2013.01); *G01R 1/067* (2013.01); *G02F 1/1309* (2013.01); *G01R 1/0408* (2013.01)

(58) Field of Classification Search
CPC ........ G09G 3/006; G09G 3/00; G01R 1/0408; G01R 1/067; G02F 1/1309
(Continued)

(56) References Cited

U.S. PATENT DOCUMENTS

2016/0047857 A1*  2/2016  Lee .................... G01R 31/2891
                                                                    324/750.22
2016/0356812 A1   12/2016  Yang et al.

FOREIGN PATENT DOCUMENTS

CN        202995185 A       6/2013
CN        203101766 U       7/2013
(Continued)

OTHER PUBLICATIONS

Jun et al.; Translation of Korean Patent Document KR 20090006688 A; Jan. 15, 2009; Google & EPO (Year: 2009).*
(Continued)

*Primary Examiner* — Melissa J Koval
*Assistant Examiner* — Rahul Maini
(74) *Attorney, Agent, or Firm* — Ladas & Parry LLP; Hermine Valizadeh (57) ABSTRACT

An adjustment device for light-on testing and a light-on testing device are provided. The adjustment device for light-on testing including a substrate, a first pressing member and a second pressing member disposed on the substrate, wherein, the first pressing member and the second pressing member are disposed on the substrate and capable of moving with respect to each other, so that a distance therebetween is adjustable; and the first pressing member and the second
(Continued)

pressing member are respectively provided with a probe for contacting a product to be subjected to the light-on testing.

17 Claims, 10 Drawing Sheets

(51) Int. Cl.
 *G02F 1/13* (2006.01)
 *G01R 1/04* (2006.01)
(58) Field of Classification Search
 USPC .................................................... 324/750.25
 See application file for complete search history.

(56) References Cited

FOREIGN PATENT DOCUMENTS

| | | |
|---|---|---|
| CN | 105093574 A | 11/2015 |
| CN | 205539809 U | 8/2016 |
| JP | 2003-322872 A | 11/2003 |
| KR | 20090006688 A | 1/2009 |

OTHER PUBLICATIONS

International Search Report and Written Opinion dated May 20, 2016; PCT/CN2017/072461.

\* cited by examiner

United States Patent

ADJUSTMENT DEVICE FOR LIGHT-ON TESTING AND LIGHT-ON TESTING DEVICE

TECHNICAL FIELD

At least one embodiment of the present disclosure relates to an adjustment device for light-on testing and a light-on testing device.

BACKGROUND

In the manufacturing process of display products, a light-on testing device must be adopted for light-on testing on products obtained after substrate process and package. The display products, for instance, include liquid crystal displays (LCDs) and active-matrix organic light-emitting diode (AMOLED) displays.

SUMMARY

At least one embodiment of the present disclosure relates to an adjustment device for light-on testing and a light-on testing device, which are used for testing different types of products to be subjected to the light-on testing.

At least one embodiment of the present disclosure provide an adjustment device for light-on testing, comprising a substrate, a first pressing member and a second pressing member disposed on the substrate, wherein the first pressing member and the second pressing member are disposed on the substrate and capable of moving with respect to each other, so that a distance therebetween is adjustable; and the first pressing member and the second pressing member are respectively provided with a probe for contacting a product to be subjected to the light-on testing.

At least one embodiment of the present disclosure provide a light-on testing device, comprising the adjustment device for light-on testing provided by any one of the embodiment of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

01—substrate; 02—first pressing member; 03—second pressing member; 04—first bolt; 05—second bolt; 06—fastener; 08—probe; 09—product to be subjected to light-on testing; 10—first probe adjusting mechanism; 13—first gear drive mechanism; 131—first gear group; 132—second gear group; 130—gear; 15—first drive rod; 151—first thread; 16—first knob; 011—first moving mechanism; 021—second moving mechanism; 0111—first recess; 0211—first protrusion; 0011—third moving mechanism; 031—fourth moving mechanism; 00111—second recess; 0311—second protrusion; 101—first probe strip; 022—third recess; 1012—third protrusion; 1013—first threaded hole; 1015—first gear shaft; 210—second probe adjusting mechanism; 2101—second probe strip; 21012—fourth protrusion; 21013—second threaded hole; 21015—second gear shaft; 215—second drive rod; 2151—second thread; 032—fourth recess; 213—second gear drive mechanism; 2131—third gear group; 2132—fourth gear group; 17—scale ruler; 216—second knob.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the object which is described is changed, the relative position relationship can be changed accordingly.

In the process of light-on testing, as different types of display products have different sizes and shapes, layout designs of cell testing pad areas for light-on testing of the products are different. Therefore, a light-on testing device corresponding to a type must be customized for display products of each fixed type. Each light-on testing device can only be adapted to products of one or two fixed types and cannot correspond to other products of different types.

At least one embodiment of the present disclosure provides an adjustment device for light-on testing applied to a light-on testing device, which can correspond to the light-on testing of products of different types.

Figure 1:
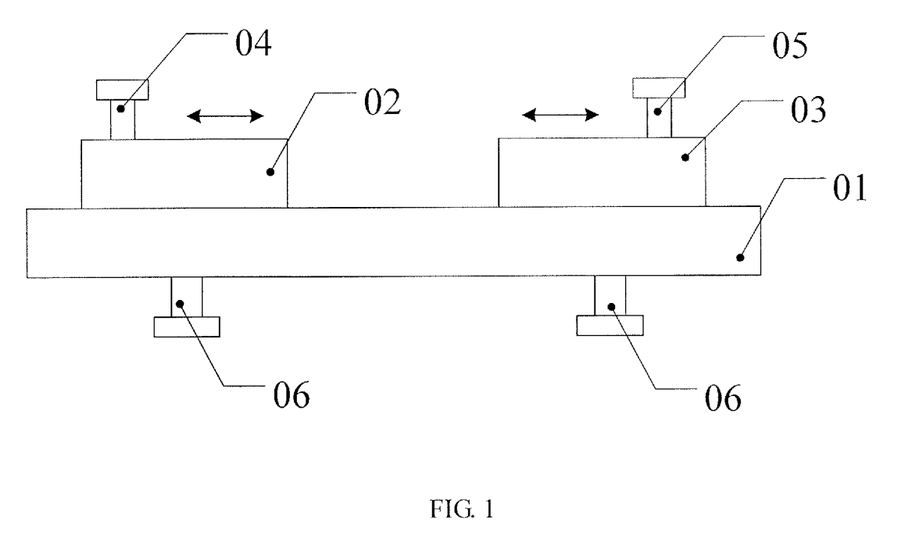
FIG. 1 is a front view of an adjustment device for light-on testing provided by one embodiment of the present disclosure.

As illustrated in FIG. 1, one embodiment of the present disclosure provides an adjustment device for light-on testing, which includes a substrate 01, and a first pressing member 02 and a second pressing member 03 which are disposed on the substrate 01. The first pressing member 02 and the second pressing member 03 are disposed on the substrate 01 and capable of moving with respect to each other, so that a distance between the first pressing member and the second pressing member can be adjusted. Moreover, the first pressing member 02 and the second pressing member 03 are respectively provided with a probe 08 (the probe 08 may refer to FIG. 3) for contacting a product to be subjected to the light-on testing 09 (the product to be subjected to the light-on testing 09 refers to FIG. 2).

In the adjustment device for light-on testing provided by one embodiment of the present disclosure, the distance between the first pressing member 02 and the second pressing member 03 is adjustable, so that different types of products to be subjected to the light-on testing can be tested.

It should be noted that the description that the first pressing member 02 and the second pressing member 03 are disposed on the substrate 01 and capable of moving with respect to each other refers to that the first pressing member 02 or the second pressing member 03 is capable of moving on the substrate 01, or both of the first pressing member 02 and the second pressing member 03 are capable of moving on the substrate 01, so that the distance between the first pressing member 02 and the second pressing member 03 is adjustable (can be adjusted).

Figure 3:
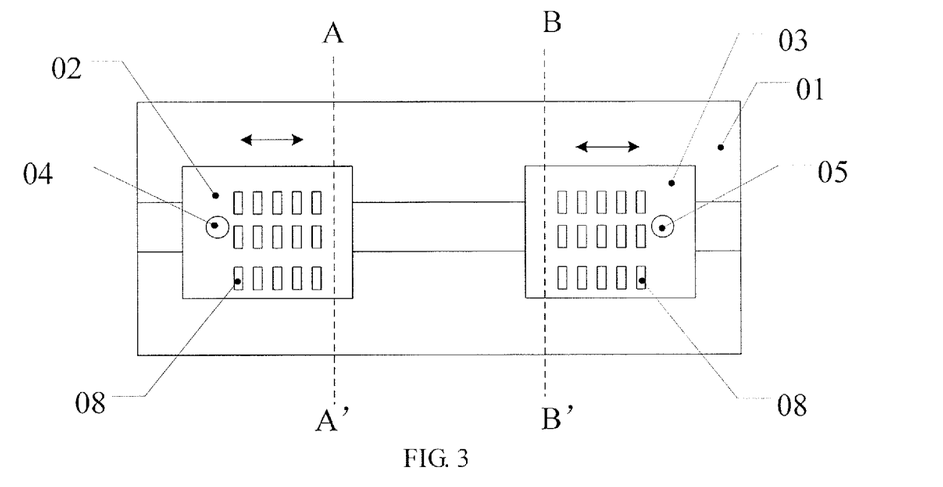
FIG. 3 is a top view of an adjustment device for light-on testing provided by one example of the present disclosure.
Figure 5:
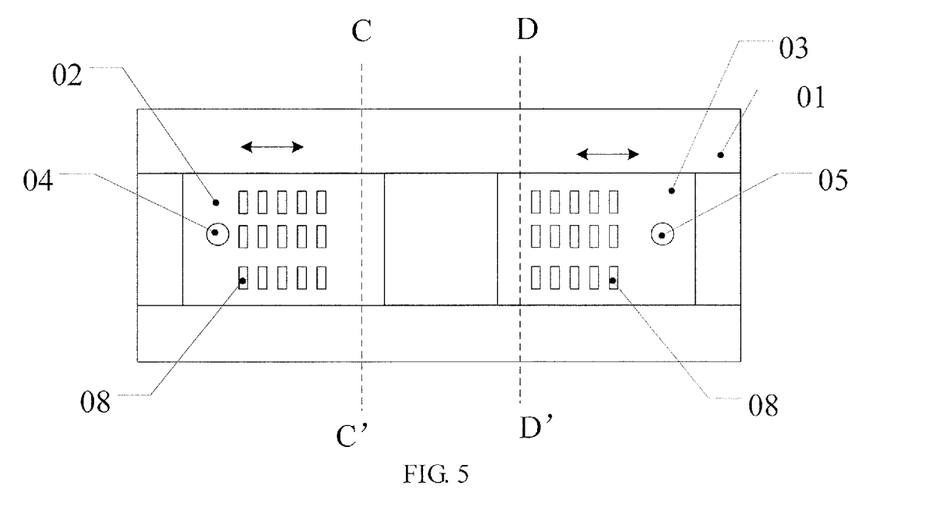
FIG. 5 is a top view of an adjustment device for light-on testing provided by another example of the present disclosure.
Figure 6A:
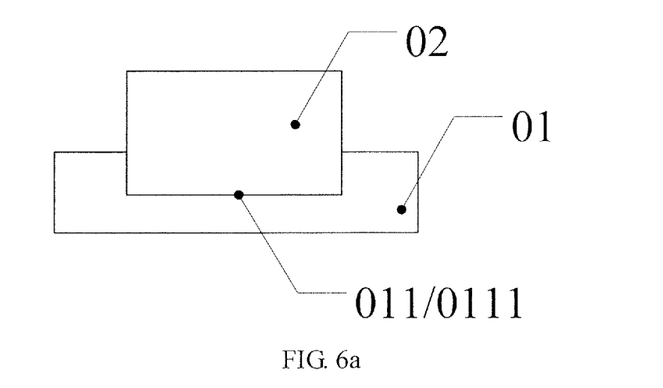
FIG. 6a is a sectional view of FIG. 5 along C-C' direction provided by one example of the present disclosure (a first pressing member is matched and connected with a substrate)
Figure 6B:
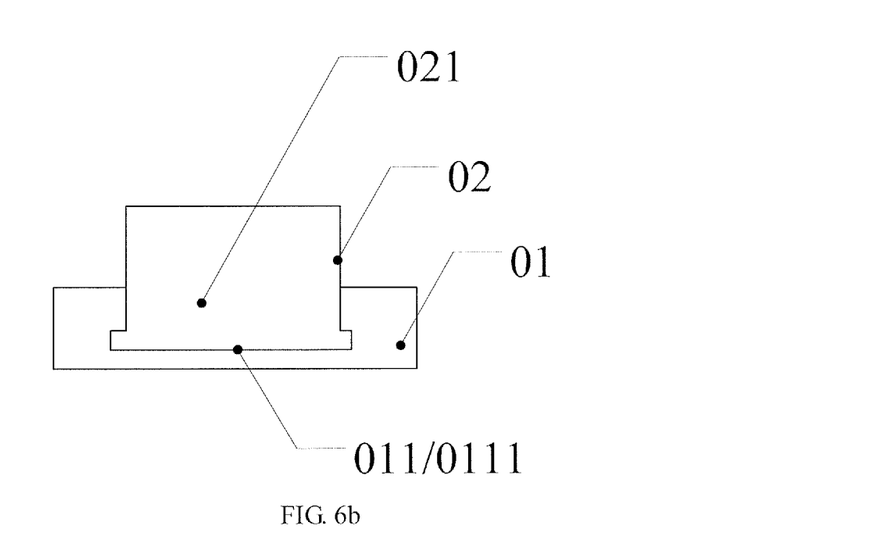
FIG. 6b is a sectional view of FIG. 5 along C-C' direction provided by another example of the present disclosure (a first pressing member is matched and connected with a substrate)
Figure 7A:
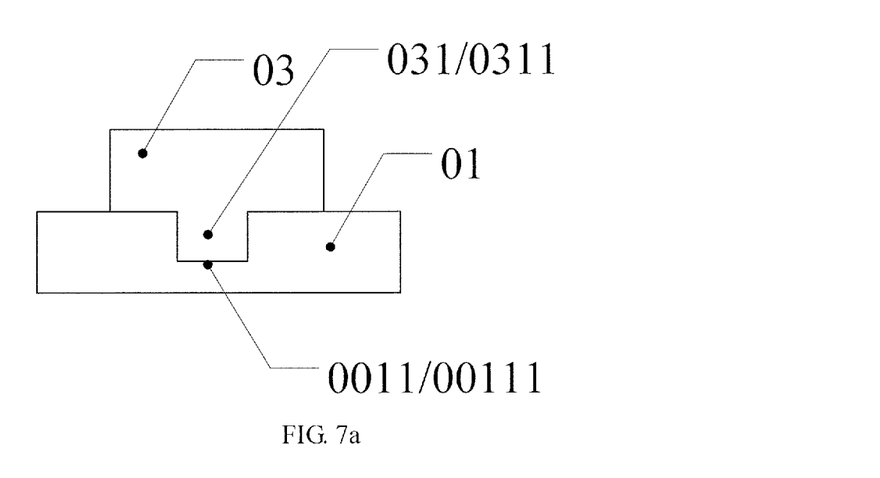
FIG. 7a is a sectional view of FIG. 3 along B-B' direction provided by one example of the present disclosure (a second pressing member is matched and connected with a substrate)
Figure 7B:
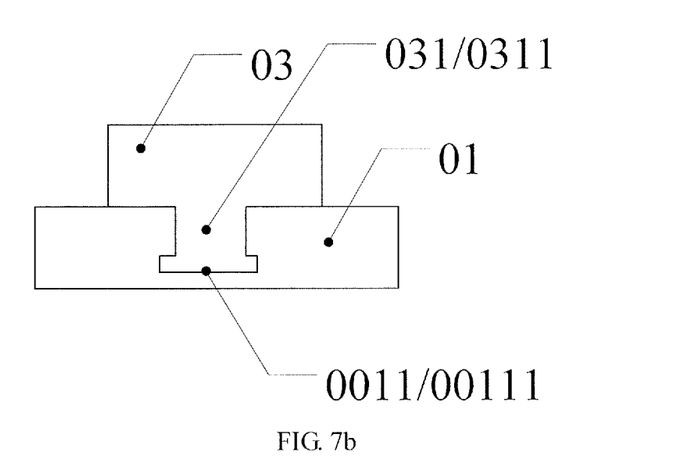
FIG. 7b is a sectional view of FIG. 3 along B-B' direction provided by another example of the present disclosure (a second pressing member is matched and connected with a substrate)
Figure 8A:
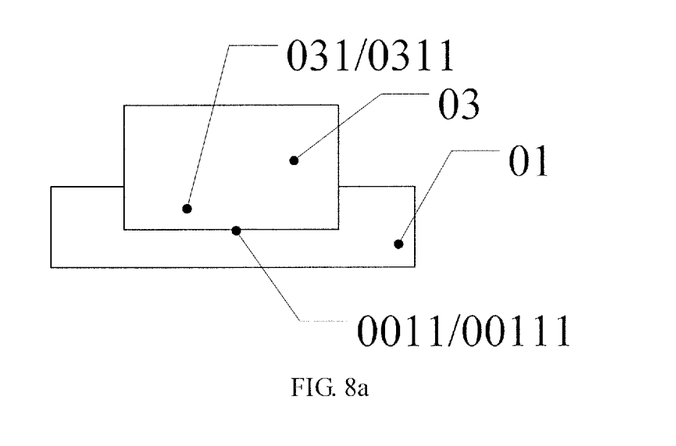
FIG. 8a is a sectional view of FIG. 5 along D-D' direction provided by one example of the present disclosure (a second pressing member is matched and connected with a substrate)
Figure 8B:
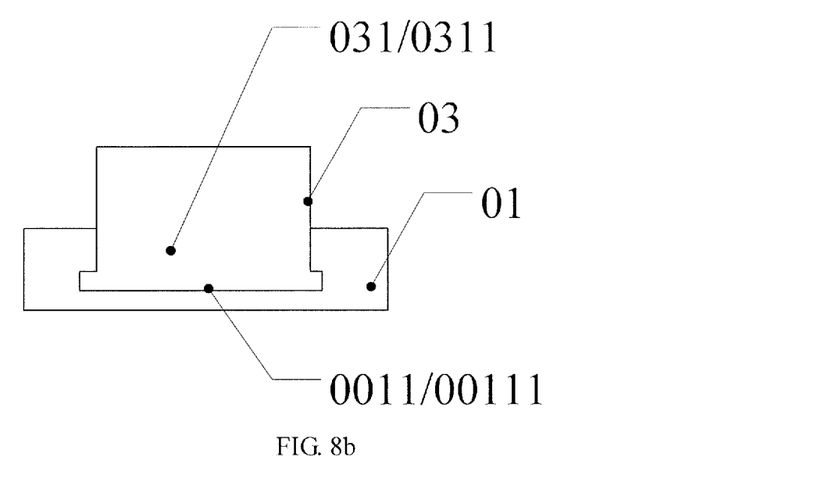
FIG. 8b is a sectional view of FIG. 5 along D-D' direction provided by another example of the present disclosure (a second pressing member is matched and connected with a substrate)

The top view of FIG. 1 can be as illustrated in FIGS. 3 and 5. FIGS. 3 and 5 illustrate two matched structures of the first pressing member 02 and the second pressing member 03 and the substrate. It should be noted that FIGS. 3 and 5 are only illustrative, and no limitation is given to the matched structure of the first pressing member 02 and the second pressing member 03 and the substrate in the embodiment of the present disclosure.

Figure 4A:
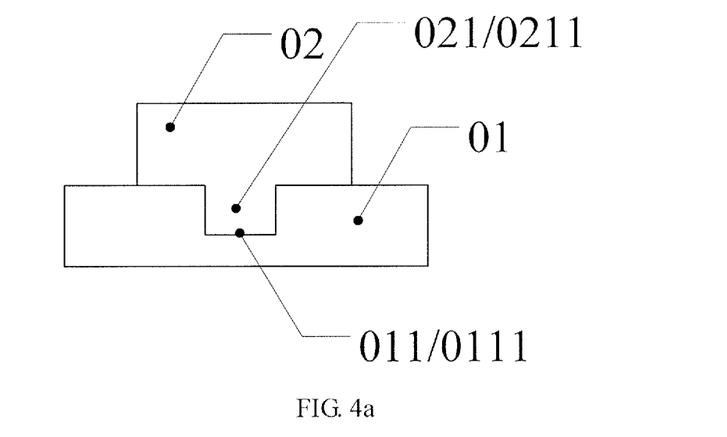
FIG. 4a is a sectional view of FIG. 3 along A-A' direction provided by one example of the present disclosure (a first pressing member is matched and connected with a substrate)
Figure 4B:
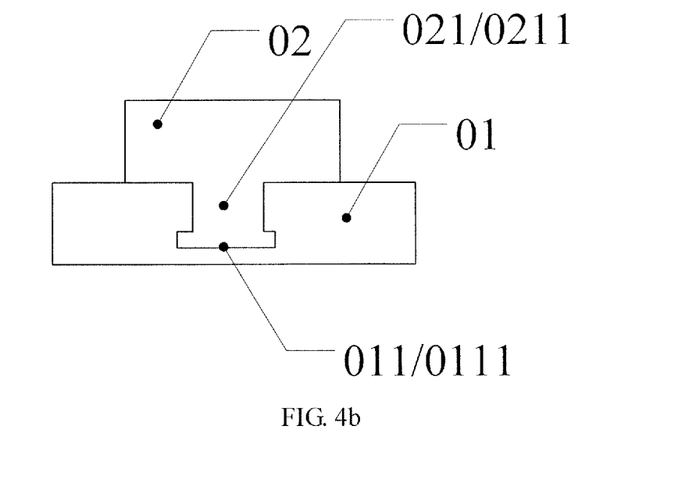
FIG. 4b is a sectional view of FIG. 3 along A-A' direction provided by another example of the present disclosure (a first pressing member is matched and connected with a substrate)
Figure 4C:
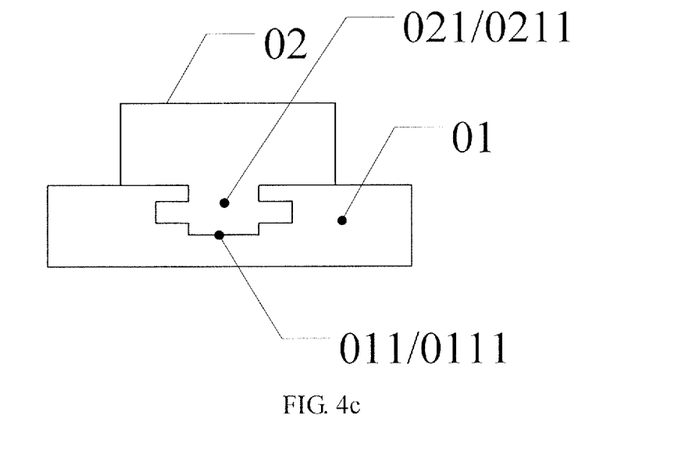
FIG. 4c is a sectional view of FIG. 3 along A-A' direction provided by another example of the present disclosure (a first pressing member is matched and connected with a substrate)
Figure 4D:
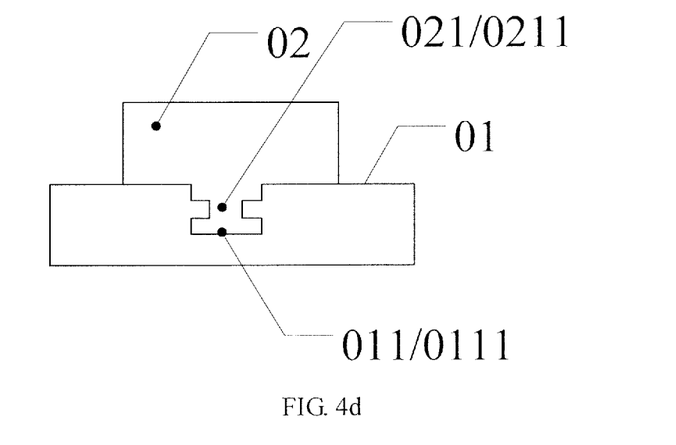
FIG. 4d is a sectional view of FIG. 3 along A-A' direction provided by another example of the present disclosure (a first pressing member is matched and connected with a substrate)

As illustrated in FIGS. 4*a*-4*d* and 6*a*-6*b*, in some examples, a first moving mechanism 011 is disposed on the substrate 01, and a second moving mechanism 021 matched with the first moving mechanism 011 is disposed on the first pressing member 02, so that the first pressing member 02 is capable of moving with respect to the substrate 01. For instance, one of the first moving mechanism 011 and the second moving mechanism 021 is a first recess 0111, and the other is a first protrusion 0211. The first recess 0111 and the first protrusion 0211 are matched and connected with each other so as to move with respect to each other. Description is given in FIGS. 4*a*-4*d*, 6*a* and 6*b* by taking the case that the first moving mechanism 011 (the first recess 0111) is disposed on the substrate 01 and the second moving mechanism 021 (the first protrusion 0211) is disposed on the first pressing member 02 as an example. It should be noted that the embodiment of the present disclosure is not limited thereto. For instance, the first moving mechanism 011 (the first recess 0111) can also be disposed on the first pressing member 02, and correspondingly, the second moving mechanism 021 (the first protrusion 0211) can be disposed on the substrate 01. As illustrated in FIGS. 4*b*-4*c*, in order to allow the first pressing member to move along one plane on the substrate 01 better, a protrusion is further provided on the first protrusion, and correspondingly, the first recess can be provided with a recess matched with the protrusion on the first protrusion. Or as illustrated in FIG. 4*d*, the first protrusion can be provided with a recess, and correspondingly, the first recess can be provided with a protrusion matched with the recess on the first protrusion. It should be noted that the recess and the protrusion in the embodiment of the present disclosure can be matched with each other to form a clamped structure, and the recess and the protrusion can move with respect to each other. Moreover, the engagement of the recess and the protrusion at other positions can refer to the above description and illustration.

In one example, the adjustment device for light-on testing can also include a first bolt 04 configured to fix the first pressing member 02 on the substrate 01. When the first pressing member moves to an appropriate position, the first bolt 04 can be fastened to fix the first pressing member 02 on the substrate 01.

In one example, as illustrated in FIGS. 7*a*, 7*b*, 8*a* and 8*b*, a third moving mechanism 0011 is disposed on the substrate 01, and a fourth moving mechanism 031 matched with the third moving mechanism 0011 is disposed on the second pressing member 03, so that the second pressing member 03 can move with respect to the substrate 01. For instance, one of the third moving mechanism 0011 and the fourth moving mechanism 031 is a second recess 00111, and the other is a second protrusion 0311. The second recess 00111 and the second protrusion 0311 are matched and connected with each other so as to move with respect to each other. Description is given in FIGS. 7*a*, 7*b*, 8*a* and 8*b* by taking the case that the third moving mechanism 0011 (the second recess 00111) is disposed on the substrate 01 and the fourth moving mechanism 031 (the second protrusion 0311) is disposed on the second pressing member 03 as an example. It should be noted that the embodiment of the present disclosure is not limited thereto. For instance, the third moving mechanism 0011 (the second recess 00111) can also be disposed on the second pressing member 03, and correspondingly, the fourth moving mechanism 031 (the second protrusion 0311) can be disposed on the substrate 01. The structural design and the engagement of the second recess 00111 and the second protrusion 0311 can refer to the above description on the first recess 0111 and the first protrusion 0211. No further description will be given here.

In one example, the adjustment device for light-on testing can further include a second bolt 05 configured to fix the second pressing member 03 on the substrate 01. When the second pressing member moves to an appropriate position, the second bolt 05 can be fastened to fix the second pressing member 03 on the substrate 01.

Description is given to the testing of products to be subjected to the light-on testing with different sizes by taking the case that both the first pressing member 02 and the second pressing member 03 can move (slide) on the substrate 01 and the first bolt 04 and the second bolt 05 are arranged as an example. Different distances (spacing) are obtained by adjusting (e.g., manual adjustment) the position of the first pressing member 02 and the second pressing member 03, so as to be adapted to the size of different products to be subjected to the light-on testing and correspond to cell testing pad areas of the products. After the position of the first pressing member 02 and the second pressing member 03 is adjusted, the first pressing member 02 and the second pressing member 03 are respectively fixed on the substrate 01 by the first bolt 04 and the second bolt 05. For instance, the first bolt 04 can be screwed into a position corresponding to a slotted hole in the first pressing member 02, and the second bolt 05 can be screwed into a position corresponding to a slotted hole in the second pressing member 03.

On this basis, a first probe adjusting mechanism 10 can also be disposed on the first pressing member 02, or a second probe adjusting mechanism 210 is disposed on the second pressing member 03, or not only the first probe adjusting mechanism 10 is disposed on the first pressing member 02 but also the second probe adjusting mechanism 210 is disposed on the second pressing member 03. No limitation will be given here in the embodiment of the present disclosure. Detailed description will be given below.

Figure 9A:
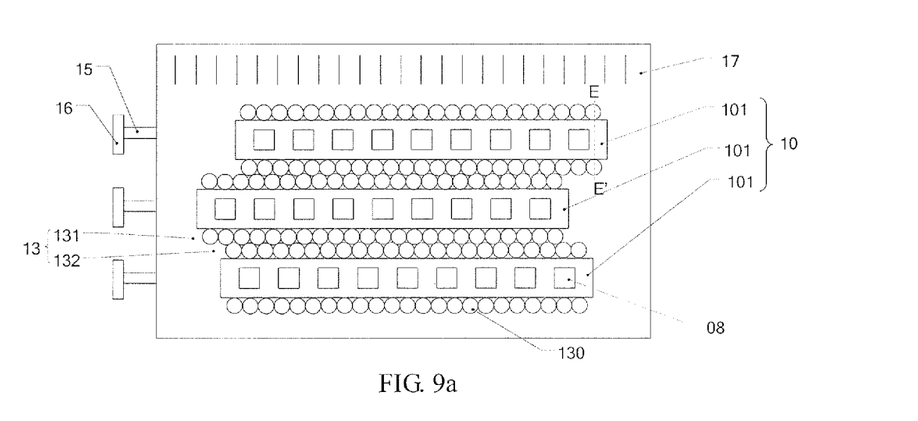
FIG. 9a is a schematic diagram of a first probe adjusting mechanism disposed on the adjustment device for light-on testing provided by one example of the present disclosure.

In one example, as illustrated in FIG. 9*a*, a first probe adjusting mechanism 10 is disposed on the first pressing member 02 and can move (capable of moving) along a surface of the first pressing member 02. For instance, the first probe adjusting mechanism 10 includes a plurality of first probe strips 101. Each first probe strip 101 includes a plurality of probes 08 (for instance, the plurality of probes 08 can be fixed on the first probe strip 101, but not limited thereto). The first probe strips 101 can move (are capable of moving) with respect to one another, so as to adjust the staggered distance of probes 08 on different first probe strips 101. Thus, the position of the probes 08 on the first probe adjusting mechanism 10 can be adjustable, and hence can correspond to products to be subjected to the light-on testing with different cell testing pad areas. Therefore, the application of the adjustment device for light-on testing can be further expanded. It should be noted that: in the process of light-on testing, the light-on testing can be completed by adjusting the first probe strips to form a probe structure having the same structure with the cell testing pad area of the product to be subjected to the light-on testing.

Figure 9B:
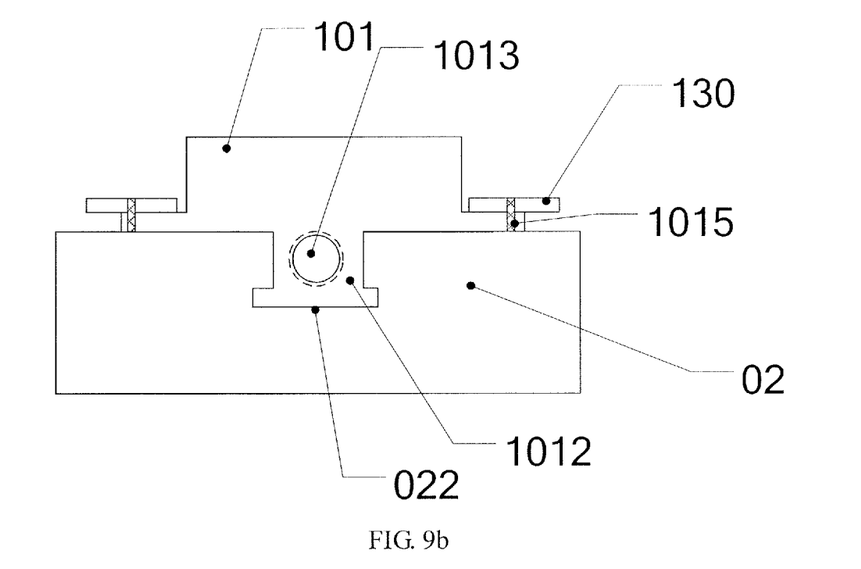
FIG. 9b is a schematic sectional view of FIG. 9a along E-E' direction.
Figure 9C:
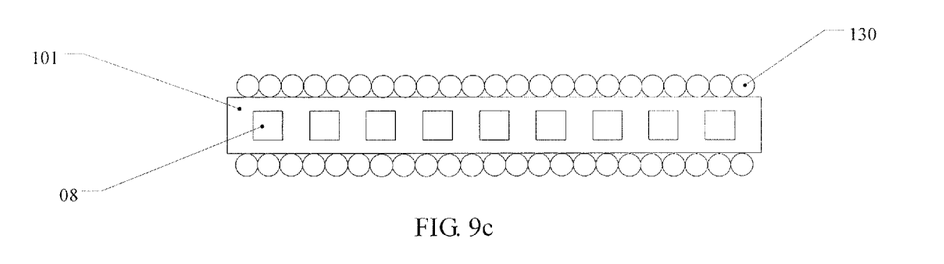
FIG. 9c is a schematic diagram of a first probe strip of the adjustment device for light-on testing provided by one example of the present disclosure.
Figure 9D:
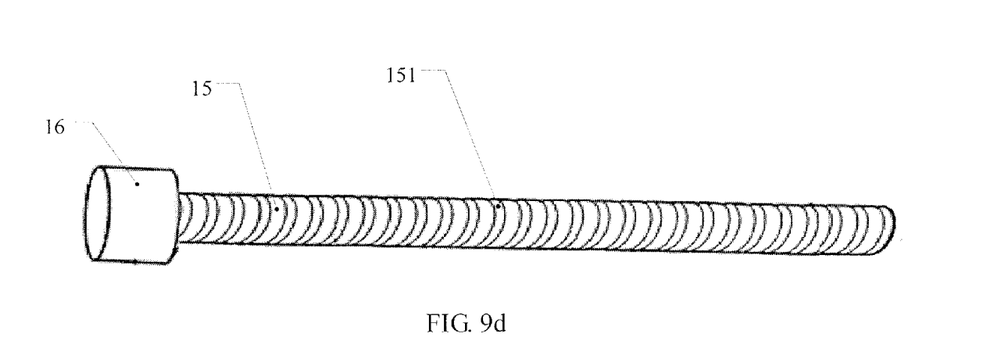
FIG. 9d is a schematic diagram of a first drive rod of the adjustment device for light-on testing provided by one example of the present disclosure.

In one example, as illustrated in FIG. 9*b*, one of each first probe strip 101 and the first pressing member 02 is provided with a third recess 022, and the other is provided with a third protrusion 1012. The third recess 022 and the third protrusion 1012 are matched and connected with each other so as to move with respect to each other. Description is given in FIG. 9*b* by taking the case that the third recess 022 is disposed on the first pressing member 02 and the third protrusion 1012 is disposed on the first probe strip 101 as an example. As similar to the above description, in the embodiment of the present disclosure, the third recess 022 can also be disposed on the first probe strip 101, and correspondingly, the third protrusion 1012 can be disposed on the first pressing member 02. The structural design and the engagement of the third recess 022 and the third protrusion 1012 can refer to the above description on the first recess 0111 and the first protrusion 0211. No further description will be given here.

In one example, as illustrated in FIGS. 9*a*-9*d*, in order to accurately adjust the staggered distance of the probes between different first probe strips 101, the adjustment device for light-on testing can further include a first drive rod 15. Each first probe strip 101 is also provided with a first threaded hole 1013. A first thread 151 on the first drive rod 15 is engaged with the first threaded hole 1013, so that the first probe strip 101 can move along an extending direction of the first drive rod 15 by rotating the first drive rod 15, and hence the staggered distance of the probes 08 on adjacent first probe strips 101 can be adjusted. For instance, a first knob 16 can also be disposed on the first drive rod 15 to provide convenience for adjustment. For instance, the first drive rod 15 can be rotated through the first knob 16, so that gears between adjacent first probe strips 101 can rotate, and hence the probes on the adjacent first probe strips 101 can move with respect to one another.

In one example, as illustrated in FIGS. 9*a*-9*d*, in order to accurately adjust the staggered distance of the probes between different first probe strips 101, a first gear drive mechanism 13 is disposed between adjacent first probe strips 101 and includes a first gear group 131 and a second gear group 132 which are matched with each other. The first gear group 131 and the second gear group 132 are respectively disposed on adjacent first probe strips 101 and respectively include at least one gear 130. As illustrated in FIG. 9*b*, the gear 130 can be mounted on the first probe strip 101 through a first gear shaft 1015. The gears in the first gear group 131 and the gears in the second gear group 132 are engaged with each other, so that two adjacent first probe strips 101 can move on the first pressing member 02 through gear drive, and hence the staggered distance between two adjacent rows of probes can be adjusted.

For instance, the staggered distance of the probes between different first probe strips 101 can be accurately adjusted by the cooperation between the first drive rod 15 and the first gear drive mechanism 13. For instance, the travel degree of the gear 130 can be adjusted by adjusting the number of revolutions of the first drive rod 15. For instance, when the first drive rod 15 rotates for one cycle, the gear 130 also rotates for one cycle, but not limited thereto.

Figure 10A:
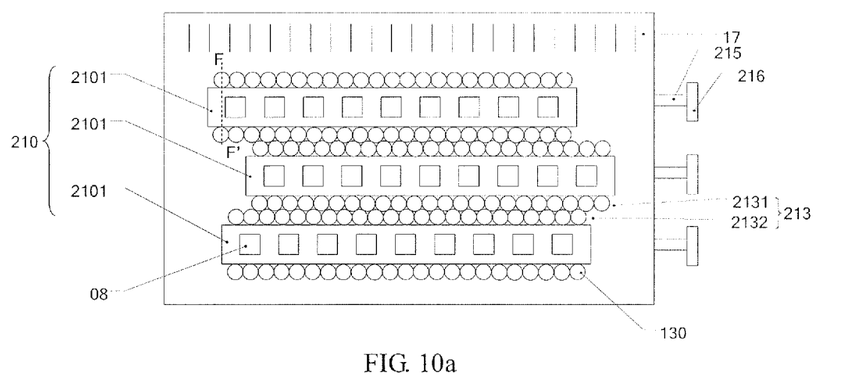
FIG. 10a is a schematic diagram of a second probe adjusting mechanism disposed on the adjustment device for light-on testing provided by one example of the present disclosure.

In one example, as illustrated in FIG. 10a, a second probe adjusting mechanism 210 is disposed on the second pressing member 03 and can move along a surface of the second pressing member 03. For instance, the second probe adjusting mechanism 210 includes a plurality of second probe strips 2101. Each second probe strip 2101 includes a plurality of probes 08 (for instance, the plurality of probes 08 can be fixed on the second probe strip 2101, but not limited thereto). The second probe strips 2101 are capable of moving with respect to one another, so as to adjust the staggered distance of probes on different second probe strips 2101. Thus, the position of the probes 08 on the second probe adjusting mechanism 210 can be adjustable, and hence can correspond to products to be subjected to the light-on testing with different cell testing pad areas. Therefore, the application of the adjustment device for light-on testing can be further expanded.

Figure 10B:
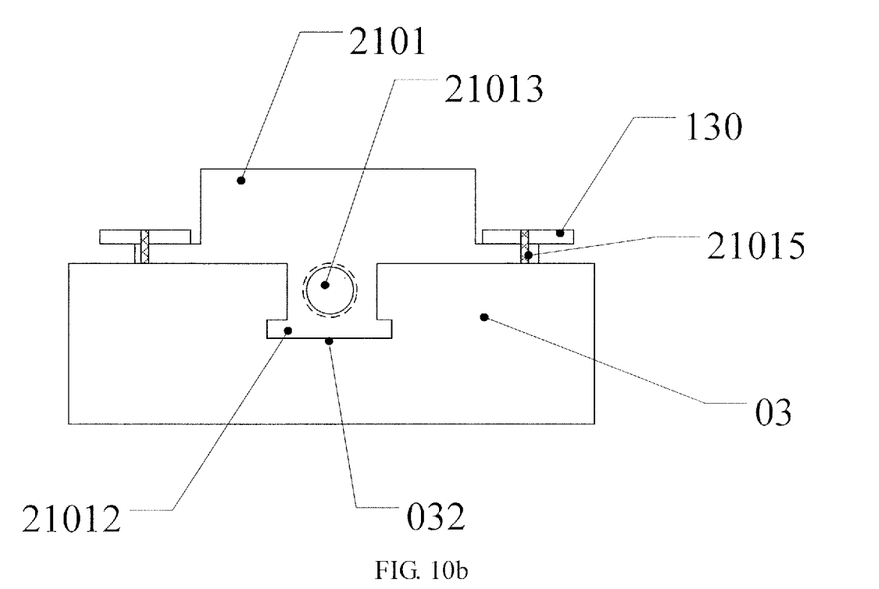
FIG. 10b is a schematic sectional view of FIG. 10a along F-F' direction.
Figure 10C:
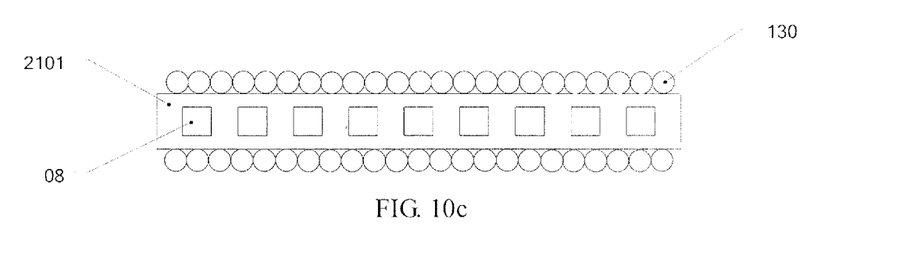
FIG. 10c is a schematic diagram of a second probe strip of the adjustment device for light-on testing provided by one example of the present disclosure.
Figure 10D:
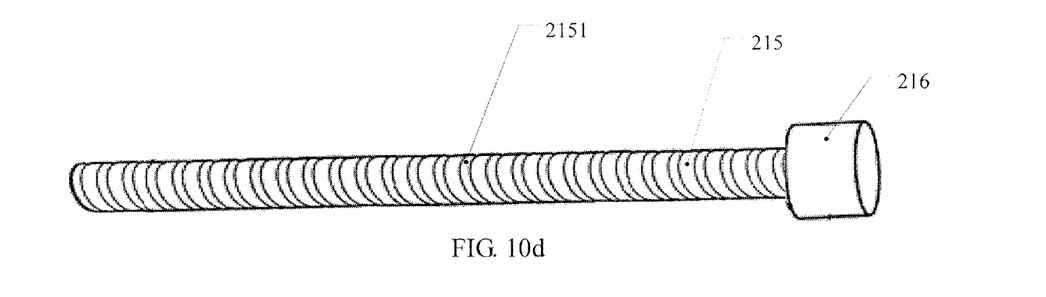
FIG. 10d is a schematic diagram of a second drive rod of the adjustment device for light-on testing provided by one example of the present disclosure.

In one example, as illustrated in FIG. 10b, one of each second probe strip 2101 and the second pressing member 03 is provided with a fourth recess 032, and the other is provided with a fourth protrusion 21012. The fourth recess 032 and the fourth protrusion 21012 are matched and connected with each other so as to move with respect to each other, so that the staggered distance of the probes 08 on adjacent second probe strips 2101 can be adjusted. Description is given in FIG. 10b by taking the case that the fourth recess 032 is disposed on the second pressing member 03 and the fourth protrusion 21012 is disposed on the second probe strip 2101 as an example. As similar to the above description, in the embodiment of the present disclosure, the fourth recess 032 can also be disposed on the second probe strip 2101, and correspondingly, the fourth protrusion 21012 can be disposed on the second pressing member 03. The structural design and the engagement of the fourth recess 032 and the fourth protrusion 21012 can refer to the above description on the first recess 0111 and the first protrusion 0211. No further description will be given here.

In one example, as illustrated in FIGS. 10a-10d, in order to accurately adjust the staggered distance of the probes between different second probe strips 2101, the adjustment device for light-on testing can further include a second drive rod 215. Each second probe strip 2101 is also provided with a second threaded hole 21013. A second thread 2151 on the second drive rod 215 is engaged with the second threaded hole 21013, so that the second probe strip 2101 can move along an extending direction of the second drive rod 215 by rotating the second drive rod 215. For instance, a second knob 216 can also be disposed on the second drive rod 215 to provide convenience for adjustment. For instance, the second drive rod 215 can be rotated by rotating the second knob 216, so that gears between adjacent second probe strips 2101 can rotate, and hence the probes on adjacent second probe strips 2101 can move with respect to one another.

In one example, as illustrated in FIGS. 10a-10d, in order to accurately adjust the staggered distance of the probes between different second probe strips 2101, a second gear drive mechanism 213 is disposed between adjacent second probe strips 2101 and includes a third gear group 2131 and a fourth gear group 2132 which are matched with each other. The third gear group 2131 and the fourth gear group 2132 are respectively disposed on adjacent second probe strips 2101 and respectively include at least one gear 130. As illustrated in FIG. 10b, the gear 130 can be mounted on the second gear probe 2101 through a second gear shaft 21015. The gears in the third gear group 2131 and the gears in the fourth gear group 2132 are engaged with each other, so that two adjacent second probe strips 2101 can move on the third pressing member 03 through gear drive, and hence the staggered distance between two adjacent rows of probes can be adjusted.

For instance, the staggered distance of the probes between different second probe strips 2101 can be accurately adjusted by the cooperation between the second drive rod 215 and the second gear drive mechanism 213. For instance, the travel degree of the gear 130 can be adjusted by adjusting the number of revolutions of the second drive rod 215. For instance, when the second drive rod 215 rotates for one cycle, the gear 130 also rotates for one cycle, but not limited thereto.

In one example, a scale ruler 17 can be disposed on at least one of the first pressing member 02 or the second pressing member 03. By the arrangement of the scale ruler 17, the displacement between any two rows of probes can be observed, so that the adjustment of the staggered distance of the probes can be more convenient and more well-founded. For instance, the distance between adjacent scales can be 0.1 mm, but not limited thereto.

Figure 2:
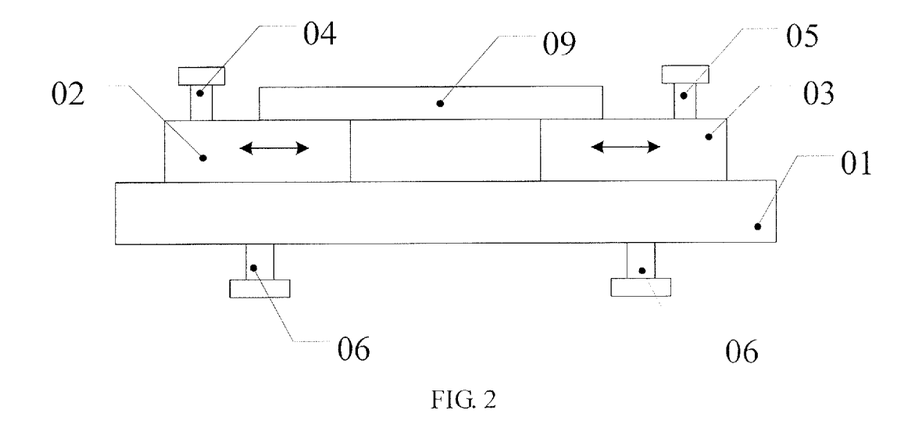
FIG. 2 is a schematic diagram illustrating a process of testing a product to be subjected to the light-on testing by an adjustment device for light-on testing provided by one example of the present disclosure.

In one example, as illustrated in FIGS. 1-2, the adjustment device for light-on testing can further include a fastener 06 connected with a light-on testing device. The fastener 06 can be configured to fix the adjustment device for light-on testing on the light-on testing device.

At least one embodiment of the present disclosure provides a light-on testing device, which includes any adjustment device for light-on testing provided by the embodiment of the present disclosure.

The adjustment device for light-on testing and the light-on testing device, provided by the embodiment of the present disclosure, solve the problem that a light-on testing device corresponding to a type must be customized for products of each type, can correspond to the light-on testing of products of different types, and hence can effectively reduce the cost for light-on test.

The following is to be noted.

(1) The same reference numerals denote the same elements/components unless otherwise defined.

(2) In the drawings of the present disclosure, only the structures related to the embodiments of the present disclosure are involved, other structures can refer to usual designs.

(3) In order to clearly illustrate, a layer or an area may be amplified in the drawings of the embodiments of the present disclosure. It is to be understood that, when a member such as a layer, a film, an area or a substrate is located or disposed on or below another member, the member can be located or disposed on or below the another member directly, or an intermediate member or intermediate member(s) can be disposed.

(4) The features in different embodiments or different features in the same embodiments can be combined without conflict.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

This application claims the benefit of priority from Chinese patent application No. 201620332985.2, filed on Apr. 19, 2016, the disclosure of which is incorporated herein in its entirety by reference as a part of the present application.

What is claimed is:

1. An adjustment device for light-on testing, comprising a substrate, a first pressing member and a second pressing member disposed on the substrate, wherein,
the first pressing member and the second pressing member are disposed on the substrate and capable of moving with respect to each other, so that a distance therebetween is adjustable;
the first pressing member and the second pressing member are respectively provided with a probe for contacting a product to be subjected to the light-on testing;
a first probe adjusting mechanism is disposed on the first pressing member; and
the first probe adjusting mechanism comprises a plurality of first probe strips; each of the first probe strips comprises a plurality of probes; and the first probe strips are capable of moving with respect to one another, so as to adjust a staggered distance of probes on different first probe strips.

2. The adjustment device for light-on testing according to claim 1, wherein a first moving mechanism is disposed on the substrate, and a second moving mechanism matched with the first moving mechanism is disposed on the first pressing member, so that the first pressing member is capable of moving with respect to the substrate.

3. The adjustment device for light-on testing according to claim 2, wherein one of the first moving mechanism and the second moving mechanism is a first recess, and the other is a first protrusion; and the first recess and the first protrusion are matched and connected with each other so as to be capable of moving with respect to each other.

4. The adjustment device for light-on testing according to claim 2, further comprising a first bolt configured to fix the first pressing member on the substrate.

5. The adjustment device for light-on testing according to claim 1, wherein a third moving mechanism is disposed on the substrate, and a fourth moving mechanism matched with the third moving mechanism is disposed on the second pressing member, so that the second pressing member is capable of moving with respect to the substrate.

6. The adjustment device for light-on testing according to claim 5, wherein one of the third moving mechanism and the fourth moving mechanism is a second recess, and the other is a second protrusion; and the second recess and the second protrusion are matched and connected with each other so as to be capable of moving with respect to each other.

7. The adjustment device for light-on testing according to claim 5, further comprising a second bolt configured to fix the second pressing member on the substrate.

8. The adjustment device for light-on testing according to claim 1, wherein one of each of the first probe strips and the first pressing member is provided with a third recess, and the other is provided with a third protrusion; and the third recess and the third protrusion are matched and connected with each other so as to be capable of moving with respect to each other.

9. The adjustment device for light-on testing according to claim 8, further comprising a first drive rod, wherein each of the first probe strips is provided with a first threaded hole, and a first thread on the first drive rod is engaged with the first threaded hole, so that each of the first probe strips is capable of moving along an extending direction of the first drive rod by rotating the first drive rod, so as to adjust the staggered distance of probes on adjacent first probe strips.

10. The adjustment device for light-on testing according to claim 9, wherein a first gear drive mechanism is disposed between adjacent first probe strips and comprises a first gear group and a second gear group which are matched with each other; and the first gear group and the second gear group are respectively disposed on adjacent first probe strips and respectively comprise at least one gear.

11. The adjustment device for light-on testing according to claim 1, wherein a second probe adjusting mechanism is disposed on the second pressing member and capable of moving along a surface of the second pressing member.

12. The adjustment device for light-on testing according to claim 11, wherein the second probe adjusting mechanism comprises a plurality of second probe strips; each of the second probe strips comprises a plurality of probes; and the second probe strips are capable of moving with respect to one another, so as to adjust a staggered distance of probes on different second probe strips.

13. The adjustment device for light-on testing according to claim 12, wherein one of each of the second probe strips and the second pressing member is provided with a fourth recess, and the other is provided with a fourth protrusion; and the fourth recess and the fourth protrusion are matched and connected with each other so as to be capable of moving with respect to each other.

14. The adjustment device for light-on testing according to claim 13, further comprising a second drive rod; each of the second probe strips is provided with a second threaded hole, and a second thread on the second drive rod is engaged with the second threaded hole, so that the second probe strip is capable of moving along an extending direction of the second drive rod by rotating the second drive rod, so as to adjust the staggered distance of probes on adjacent second probe strips.

15. The adjustment device for light-on testing according to claim 14, wherein a second gear drive mechanism is disposed between adjacent second probe strips and comprises a third gear group and a fourth gear group which are matched with each other; and the third gear group and the fourth gear group are respectively disposed on adjacent second probe strips and respectively comprise at least one gear.

16. The adjustment device for light-on testing according to claim 1, wherein a scale ruler is disposed on at least one of the first pressing member and the second pressing member.

17. The adjustment device for light-on testing according to claim 3, wherein a protrusion is further disposed on the first protrusion, and the first recess is provided with a recess matched with the protrusion on the first protrusion; or the first protrusion is provided with a recess, and the first recess is provided with a protrusion matched with the recess on the first protrusion.

* * * * *